United States Patent
Poiroux et al.

(10) Patent No.: US 9,235,668 B1
(45) Date of Patent: Jan. 12, 2016

(54) COMPUTER IMPLEMENTED METHOD FOR CALCULATING A CHARGE DENSITY AT A GATE INTERFACE OF A DOUBLE GATE TRANSISTOR

(71) Applicant: COMMISSARIAT A L'ENERGIE ATOMIQUE ET AUX ENERGIES ALTERNATIVES, Paris (FR)

(72) Inventors: Thierry Poiroux, Voiron (FR); Marie-Anne Jaud, Claix (FR); Sebastien Martinie, Saint Martin le Vinoux (FR); Olivier Rozeau, Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/332,907

(22) Filed: Jul. 16, 2014

(51) Int. Cl.
*G06F 17/50* (2006.01)
*H01L 29/786* (2006.01)

(52) U.S. Cl.
CPC ...... *G06F 17/5036* (2013.01); *H01L 29/78696* (2013.01)

(58) Field of Classification Search
CPC . G06F 17/5036; G06F 17/50; G06F 17/5009; H01L 29/78696; H01L 29/165; H01L 29/7841
See application file for complete search history.

(56) References Cited

U.S. PATENT DOCUMENTS

| | | | | |
|---|---|---|---|---|
| 5,883,814 A * | 3/1999 | Luk et al. | | 716/104 |
| 6,167,363 A * | 12/2000 | Stapleton | | 703/14 |
| 6,442,735 B1 * | 8/2002 | Joshi et al. | | 716/115 |
| 6,490,546 B1 * | 12/2002 | Kimmel et al. | | 703/14 |
| 6,779,161 B1 * | 8/2004 | Poiroux et al. | | 716/104 |
| 7,093,214 B2 * | 8/2006 | Hogyoku | | 716/104 |
| 8,525,528 B2 * | 9/2013 | Garros et al. | | 324/658 |
| 8,859,945 B2 * | 10/2014 | Bernard | | 250/208.2 |
| 2003/0078763 A1 * | 4/2003 | Chuang et al. | | 703/14 |
| 2011/0050253 A1 * | 3/2011 | Garros et al. | | 324/658 |

OTHER PUBLICATIONS

Rozeau, O., et al., "Surface Potential Based Model of Ultra-Thin Fully Depleted SOI MOSFET for IC Simulations," IEEE International SQL conference, 2011, 22 pgs.

Jandhyala, S., et al., "An Efficient Robust Algorithm for the Surface-Potential Calculation of Independent DG MOSFET," IEEE Transactions on Electron Devices, vol. 58, No. 6, Jun. 2011, pp. 1663-1671.

(Continued)

*Primary Examiner* — Nikolay Yushin
(74) *Attorney, Agent, or Firm* — Pillsbury Winthrop Shaw Pittman LLP

(57) ABSTRACT

A computer implemented method for calculating a charge density $q_1$ of a first gate of a double gate transistor comprising a thin body with a first and a second gate interface, the method including determining, using a physical processor, an initial estimate $q_{1,init}$ of the charge density of the first gate; performing, using the physical processor, at least two basic corrections of the initial estimate based on a Taylor development of a function $f_{zero}(q_1)$ able to be nullified by a correct value of the charge density $q_1$ of the first gate.

19 Claims, 7 Drawing Sheets

(56) References Cited

OTHER PUBLICATIONS

Zhu, Z., et al., "Explicit Compact Surface-Potential and Drain-Current Models for Generic Asymmetric Double-Gate Metal-Oxide-Semiconductor Field-Effect Transistors," Japanese Journal of Applied Physics, vol. 46, No. 4B, 2007, pp. 2067-2072.

Khandelwal, S., et al., "BSIM-IMG: A Compact Model for Ultrathin-Body SOI MOSFETs With Back-Gate Control," IEEE Transactions on Electron Devices, vol. 59, No. 8, Aug. 2012, pp. 2019-2026.

Sahoo, A., et al., "A Computationally Efficient Generalized Poisson Solution for Independent Double-Gate Transistors," IEEE Transactions on Electron Devices, vol. 57, No. 3, Mar. 2010, pp. 632-636.

Roy, A.S., et al., "A closed-form charge-based expression for drain current in symmetric and asymmetric double gate MOSFET," Solid-State Electronics, vol. 50, 2006, pp. 687-693.

Abraham, A., et al., "Improvements in Efficiency of Surface Potential Computation for Independent DG MOSFET," IEEE Transactions on Electron Devices, vol. 59, No. 4, Apr. 2012, pp. 1199-1202.

Abebe, H., et al., "Symmetric and Asymmetric Double Gate MOSFET Modeling," Journal of Semiconductor Technology and Science, vol. 9, No. 4, Dec. 2009, pp. 225-232.

Lu, H., et al., "An Analytic Potential Model for Symmetric and Asymmetric DG Mosfets," IEEE Transactions on Electron Devices, vol. 53, No. 5, May 2006, pp. 1161-1168.

Lime, F., et al., "A physical compact DC drain current model for long-channel undoped ultra-thin body (UTB) SOI and asymmetric double-gate (DG) MOSFETs with independent gate operation," Solid-State Electronics, vol. 57, 2011, pp. 61-66.

Liu, F., et al., "Generic Carrier-Based Core Model for Undoped Four-Terminal Double-Gate MOSFETs Valid for Symmetric, Asymmetric, and Independent-Gate-Operation Modes," IEEE Transactions on Electron Devices, vol. 55, No. 3, Mar. 2008, pp. 816-826.

\* cited by examiner

US 9,235,668 B1

COMPUTER IMPLEMENTED METHOD FOR CALCULATING A CHARGE DENSITY AT A GATE INTERFACE OF A DOUBLE GATE TRANSISTOR

FIELD

This invention relates to a computer implemented method for determining a charge density in a front and/or back gate of a double gate transistor comprising a thin body having a front gate interface and a back gate interface. The charge density $q_1$ is linked to the surface potential $x_1$ through a linear dependence $q_1=x_{g1}-x_1$, where $x_{g1}$ is the gate electrostatic potential normalized to the thermal voltage of the double gate transistor. Consequently, the method also enables to determine the surface potential at a gate interface of a double gate transistor.

BACKGROUND

Ultra-thin body transistors such as FinFETs or Ultra-Thin Body and Box (UTBB) MOSFETs are required for sub-20 nm nodes because of their excellent electrostatic integrity and reduced variability. Compared to FinFET, UTBB technology on thin buried oxide presents two decisive benefits: a much simpler process than FinFET and the possibility to use the backplane bias to optimize the power consumption and speed trade-off at circuit level. To take full advantage of this latter benefit, circuit designers need compact models that describe properly the transistor behavior for a wide range of back bias.

S. Khandelwal, Y. S. Chauhan, D. D. Lu, S. Venugopalan, M. U. A. Karim, A. B. Sachid et al, "BSIM-IMG:A compact model for ultrathin-body SOI MOSFETs with back-gate control", IEEE Transactions on Electron Devices, vol. 59, pp.2019-2026, 2012 and O. Rozeau, M. A. Jaud, T. Poiroux, M. Benosman, "Surface potential based model of ultra-thin fully depleted SOI MOSFET for IC simulations", IEEE International SOI conference, 2011, have disclosed such compact models describing the transistor behavior. However, in such models, the interface between the body and the buried oxide is assumed always depleted, which provides correct results in reverse and low forward back bias (FBB) range. However, when a strong FBB is applied, inversion occurs first at the back interface, which has a significant impact on device characteristics. Consequently, the previous models are not realistic when a strong FBB is applied.

SUMMARY

An aspect of the invention provides a more realistic model enabling to determine the charge densities in the front and/or back of a double gate transistor, which provides correct results in reverse, low forward back bias but also in strong forward back bias.

Another aspect of the invention provides a full analytical calculation method of charge density that relies on very few error correction steps from a unique equation.

Another aspect of the invention provides an analytical method enabling to determine the charge densities of the front and back gates of a wide range of transistors, which provide correct results for a wide range of device geometries from thick buried oxide fully-depleted to independent double gate transistors.

To that purpose, a first aspect of the invention is directed to a computer implemented method for calculating a charge density $q_1$ of a first gate of a double gate transistor comprising a thin body with a first and a second gate interface, the method comprising:

determining, using a physical processor, an initial estimate or value $q_{1,init}$ of the charge density of the first gate;
performing, using the physical processor, at least two basic corrections of the initial estimate or value based on a Taylor development of a function $f_{zero}(q_1)$ able to be nullified by a correct value of -ero%-.1, z the charge density $q_1$ of the first gate.

DETAILED DESCRIPTION

Figure 1:
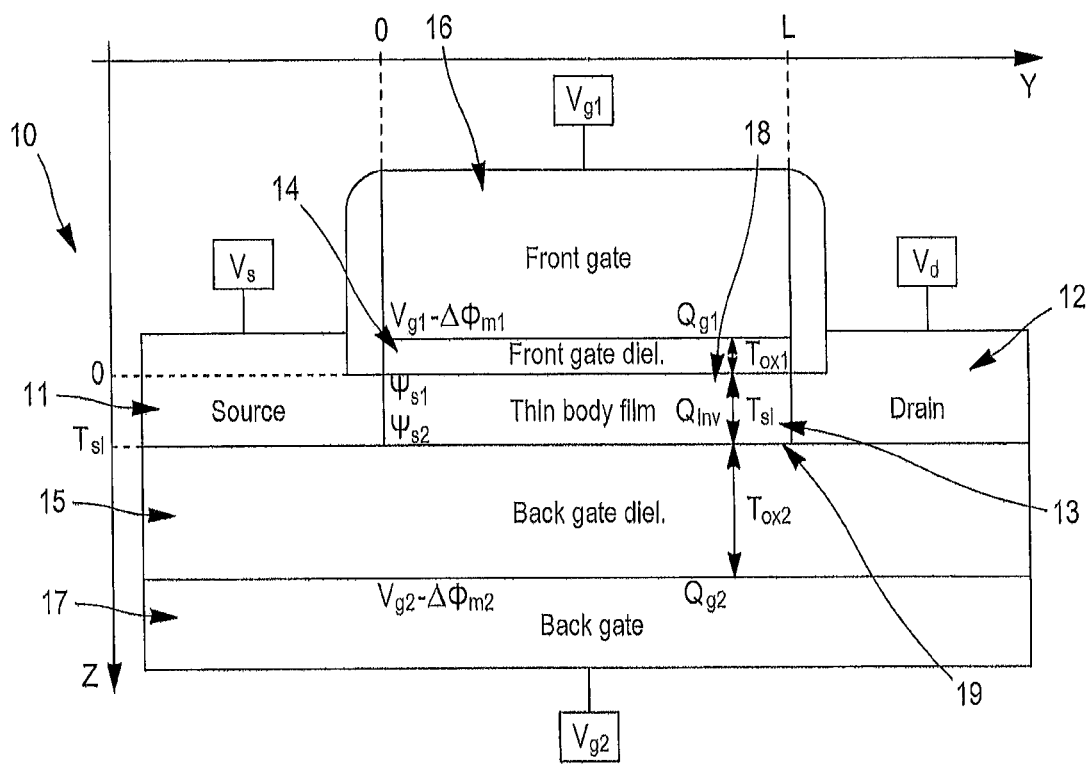
FIG. 1 is a schematic representation of a double gate transistor to which a method according to an embodiment of the invention may be applied.

FIG. 1 schematically represents a double gate transistor to which a method according to an embodiment of the invention may be applied to determine the charge density at the front gate interface and/or at the back gate interface.

This double gate transistor 10 comprises a source 11, a drain 12 and a thin body film 13 linking the source 11 to the drain 12. The double gate transistor further comprises a front gate dielectric layer 14 and a back gate dielectric layer 15. The front gate dielectric layer 14 is in contact with a front gate 16 to which a front bias $V_{g1}$ may be applied. The back gate dielectric layer 15 is in contact with a back gate 17 to which a back bias $V_{g2}$ may be applied.

The method enables to determine:

the surface potential at the interface 18 between the thin body film 13 and the front gate dielectric layer 14, referred to herein as "the front gate interface 18", and/or the charge density in the front gate 16, and/or the surface potential at the interface 19 between the thin body film 13 and the back gate dielectric layer 15, referred to herein as "the back gate interface 19", and/or the charge density in the back gate 17.

In the following detailed description, the charge density of the front gate is determined with a method according to an embodiment of the invention represented on FIG. 2a. However, the charge density of the back gate could also be determined. The method to determine the charge density of the front gate and the method to determine the charge density of the back gate are carried out exactly with the same procedure, the only difference between both calculations being the bias of the considered electrode, i.e. front or back gate. In addition, the calculation can be carried out at any place in the body, between source and drain electrodes. In the following, a generic notation $V_x$ is used to denote the quasi-Fermi potential at a given point in the body, located between the source electrode and the drain electrode. This quasi-Fermi potential has a value comprised between source and drain biases.

Figure 2A:
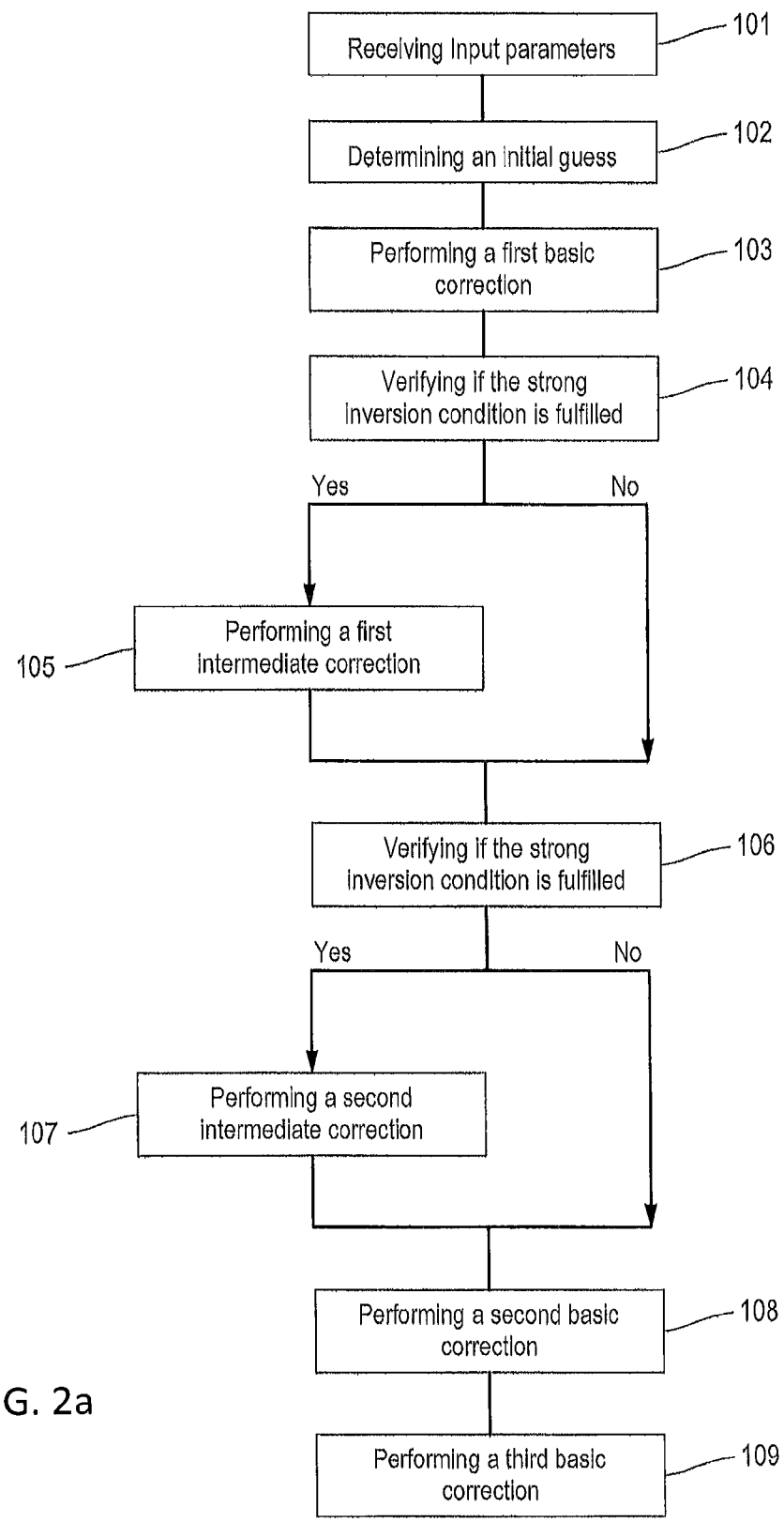
FIG. 2a is a schematic representation of the steps of a method according to an embodiment of the invention.
Figure 2B:
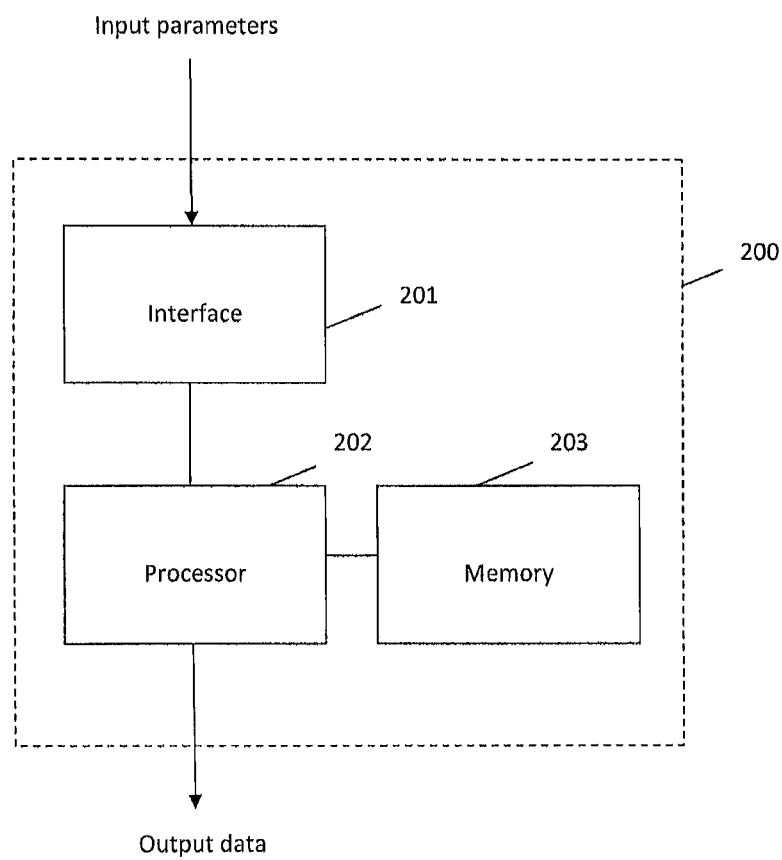
FIG. 2b represents an arrangement of a special purpose computer to implement the method of FIG. 2a according to an embodiment of the invention.

As shown in FIG. 2b, the method of FIG. 2a is implemented by a computer 200 comprising at least an interface 201, a physical processor 202 and a non-transitory memory (also broadly referred to as a non-transitory machine readable or storage medium) 203. FIG. 2b represents an embodiment of the computer 200. The computer 200 is a special purpose computer as it is programmed to perform the specific steps of the method of FIG. 2a. The non-transitory memory 203 is encoded or programmed with specific code instructions for carrying out the method of FIG. 2a. The non-transitory memory 203 is arranged in communication with the physical processor 202 so that the physical processor 202, in use, reads and executes the specific code instructions embedded in the non-transitory memory 203. The interface 201 of the special purpose computer 200 is arranged in communication with the physical processor 202 and receives input parameters that are processed by the physical processor 202.

It will be appreciated by one skilled in the art that the method of FIG. 2a represents a solution to the technological problem currently faced by circuit designers as it provides a more realistic model enabling to determine the charge densities in the front and/or back of a double gate transistor, which provides correct results in reverse, low forward back bias but also in strong forward back bias. As a result, this method allows the circuit designer to design circuits in which the power consumption and the signal and/or processing speed are optimized.

Input Parameters:

The method comprises first a step 101 of receiving, using the interface, a set of input parameters describing the effective geometry of the double gate transistor 100 and the effective biases $V_{g1}$ and $V_{g2}$ on the electrodes. The set of input parameters received by the interface 201 in an embodiment is summarized in Tables 1 and 2 below.

TABLE 1

Effective device geometry parameters

| Notation | Unit | Description |
| --- | --- | --- |
| $T_{Si}$ | m | Effective thin body film thickness |
| $T_{ox1}$ | m | Effective front gate dielectric equivalent oxide thickness |
| $T_{ox2}$ | m | Effective back gate dielectric equivalent oxide thickness |

TABLE 2

Effective biases

| Notation | Unit | Description |
| --- | --- | --- |
| $V_{g1}$ | V | Effective front gate bias |
| $V_{g2}$ | V | Effective back gate bias |
| $V_x$ | V | Effective source or drain bias |
| $\Delta\Phi_{m1}$ | eV | Front gate workfunction with respect to thin body midgap level |
| $\Delta\Phi_{m2}$ | eV | Back gate workfunction with respect to thin body midgap level |

It will be appreciated that the list of the above input parameters is not limiting. Indeed, additional (or fewer) input parameters can be used in other embodiments of the invention.

The method may then comprise a step of calculation of normalized quantities by the computer 200. The normalized quantities are calculated in the embodiment using code instructions embedded in the memory 203. The processor 202 determined the normalized quantities by executing the code instructions. Even if this step is not mandatory, it enables to ease the writing of the equations.

Normalized front gate potential: $x_{g1}=(V_{g1}-\Delta\phi_{m1})/(k_BT/q)$

Normalized back gate potential: $x_{g2}=(V_{g2}-\Delta\phi_{m2})/(k_BT/q)$

Normalized source or drain potential: $x_n=V_x/(k_BT/q)$

With $k_B$ the Boltzmann constant, T the device temperature and q the elementary charge.

Normalized front gate capacitance: $k_1=(\epsilon_{ox1}/T_{ox1})/\epsilon_{ch}/T_{Si})$ Normalized back gate capacitance: $k_2=(\epsilon_{ox2}/T_{ox2})/\epsilon_{ch}/T_{Si})$ With $\epsilon_{ox1}$ (resp. $\epsilon_{ox2}$) the front (resp. back) gate dielectric permittivity and $\epsilon_{ch}$ the thin body dielectric permittivity.

Initial Estimate or Value:

The method comprises then a step 102 of determining, using the physical processor 202, an initial estimate or value $q_{1,init}$ of the first gate charge density, linked to the surface potential at the first gate interface $x_{1,init}$ through: $q_{1,init}=x_{g1}-x_{1,init}$.

The calculation of an estimate of the first gate charge density can be carried out as follows using code instructions embedded in the memory 203. The processor 202 determined the estimate of the first gate charge density by executing the code instructions embedded in the memory. This step 102 comprises first a step of calculating, using the physical processor, saturation values of front ($x_{1,SI}$) and back ($x_{2,SI}$) interface potentials when both interfaces are in weak inversion and when both interfaces are in strong inversion. The step 102 comprises then a step of using a smoothing function between the values at weak and strong inversion to determine the initial guess.

The calculation of the saturation values of front and back interface potentials gives:

$$x_{1,St} = x_n + \ln\left(4\frac{k_1 + k_2/(1+k_2)}{A_0}\right) + \ln\left(\frac{\Delta x/2}{th(\Delta x/2)}\right) + 3$$

$$x_{2,St} = x_n + \ln\left(4\frac{k_2 + k_1/(1+k_1)}{A_0}\right) + \ln\left(\frac{\Delta x/2}{th(\Delta x/2)}\right) + 3$$

With $$A_0 = \frac{2qn_i T_{Si}^2}{\varepsilon_{ch}\phi_t},$$

$n_i$ is the intrinsic carrier density in the thin body, and $$\Delta x = \ln\left(\frac{1+k_1}{1+k_2}\right).$$

Using the physical processor 202, front ($x_{1,0}$) and back ($x_{2,0}$) interface potentials can be estimated, neglecting the interface de-coupling effect that occurs when strong inversion takes place at one of the interfaces:

$$x_{1,0} = \text{MIN\_SMOOTH}\left(x_{g1} + \frac{1/k_1}{1 + 1/k_1 + 1/k_2}(x_{g2} - x_{g1}), x_{1,St}\right)$$

$$x_{2,0} = \text{MIN\_SMOOTH}\left(x_{g2} + \frac{1/k_2}{1 + 1/k_1 + 1/k_2}(x_{g1} - x_{g2}), x_{2,St}\right)$$

The MIN_SMOOTH function may be the following function:
MIN_SMOOTH(a,b)=a−3ln(1+e$^{(a-b)/3}$)
But it could also be for example in an embodiment:
MIN_SMOOTH(a,b)=½(a+b−$\sqrt{(a-b)^2+\delta}$) with δ, for example, between 10 and 20

Using the physical processor 202, the initial estimate of front ($q_{1,init}$) and back ($q_{2,init}$) normalized gate charge densities are determined, accounting for interface de-coupling effect:

$$q_{1,init} = x_{g1} - \text{MIN\_SMOOTH}\left(\frac{x_{2,0} + k_1 x_{g1}}{1 + k_1}, x_{1,St}\right)$$

$$q_{2,init} = x_{g2} - \text{MIN\_SMOOTH}\left(\frac{x_{1,0} + k_2 x_{g2}}{1 + k_2}, x_{2,St}\right)$$

Figure 3:
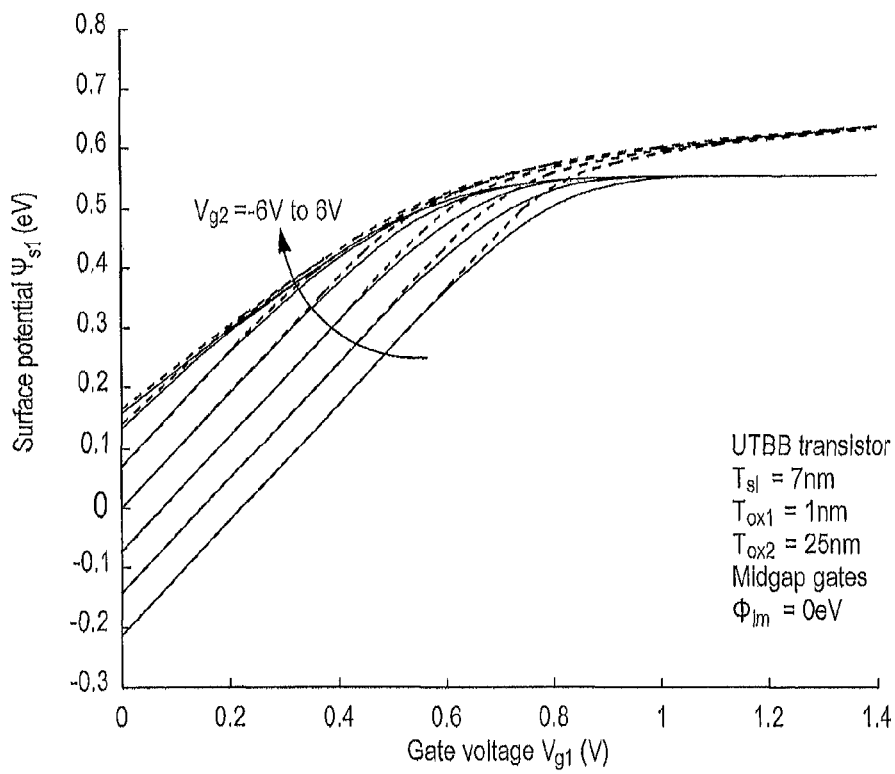
FIG. 3 represents in plain lines the surface potential obtained by the initial estimate at the front interface as a function of the front gate voltage for various back gate bias values, and in dashed lines, the charge density obtained by a numerical calculation explained in F. Liu et al, IEEE Trans. On Electron Devices, vol 55, no 3, pp 816-826, 2008 at the front interface as a function of the front gate voltage for various back gate bias values.
Figure 4:
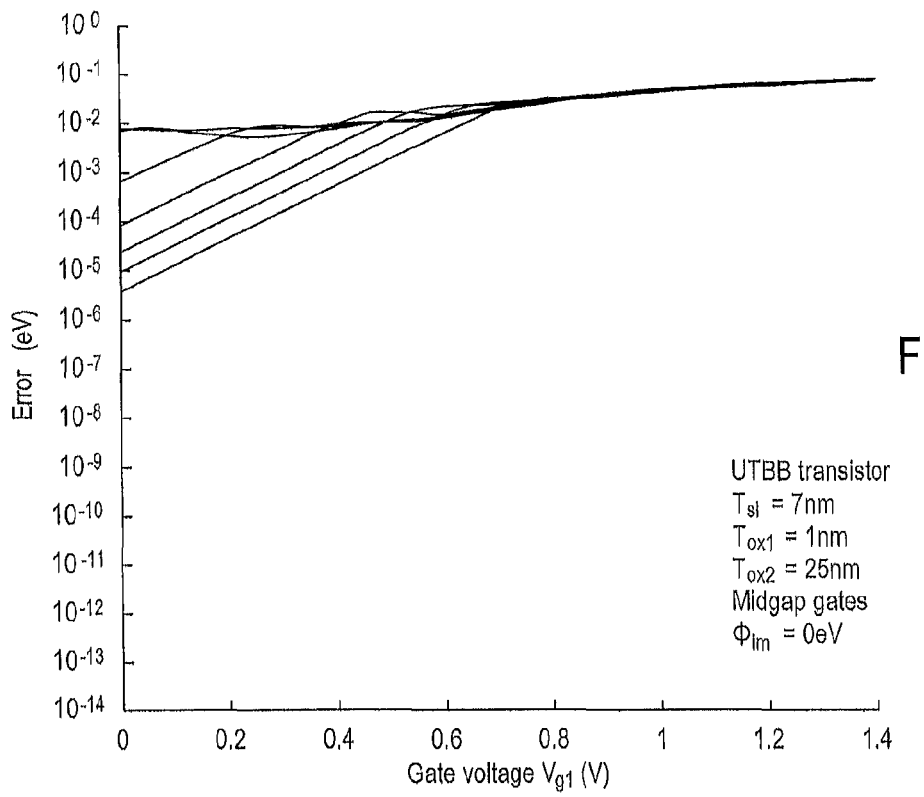
FIG. 4 represents the error on the surface potential at the front gate interface as a function of the front gate voltage for various back gate bias values after initial estimate.

FIG. 3 represents the initial estimate of the front surface potential as a function of the front gate voltage for various back gate biases. In plain lines, it can be seen the initial guess and in dash lines, the numerical calculation. FIG. 4 represents the error on the surface potential at the front gate interface as a function of the front gate voltage for various back gate bias values after initial estimate or guess.

First Basic Correction Step:

The method comprises then a first basic correction step 103 wherein the initial guess $q_{1,init}$ is corrected, using a Taylor development of a function $f_{zero}(q_1)$ able to be nullified (i.e. nullifiable) by a correct value of the charge density $q_1$ at the front gate interface. Beneficially, the Taylor development is, in an embodiment, a second order Taylor development.

Determination of the Function $f_{zero}(q_1)$ Able to be Nullified by a Correct Value of the Gate Charge Density $q_1$ at the Front Gate Interface:

The function $f_{zero}(q_1)$ is determined thanks to 1D Poisson equation and boundary conditions at the interfaces between the thin body and the front and back gate dielectrics. That function is determined using code instructions embedded in the memory 203.

As a matter of fact, assuming an undoped channel, Poisson equation is:

$$\frac{\partial^2 \psi}{\partial z^2}(y,z) = \frac{qn_i}{\varepsilon_{Si}} e^{(\psi(y,z)-\phi_{im}(y))/\phi_t} \quad (3.1)$$

Boundary conditions at the front interface are given by:

$$Q_{g1}(y) = -\varepsilon_{Si}\frac{\partial \psi}{\partial z}(y,0) = C_{ox1}(V_{g1} - \Delta\phi_{m1} - \psi_{s1}(y)) \quad (3.2)$$

Boundary conditions at the back interface are given by:

$$Q_{g2}(y) = \varepsilon_{Si}\frac{\partial \psi}{\partial z}(y,T_{Si}) = C_{ox2}(V_{g2} - \Delta\phi_{m2} - \psi_{s2}(y)) \quad (3.3)$$

Moreover, thanks to charge conservation, the following equation is obtained:

$$Q_{g1}(y) + Q_{g2}(y) + Q_{inv}(y) = 0 \quad (3.4)$$

Using a first integration of Poisson equation and the boundary conditions, the following equations are obtained:

$$Q(y)^2 = Q_{g1}(y)^2 - 2qn_i\varepsilon_{Si}\phi_t e^{(\psi_{s1}(y) - \phi_{im}(y))/\phi_t} \quad (3.5)$$

$$Q(y)^2 = Q_{g2}(y)^2 - 2qn_i\varepsilon_{Si}\phi_t e^{(\psi_{s2}(y) - \phi_{im}(y))/\phi_t} \quad (3.6)$$

Using a second equation integration of Poisson equation and boundary conditions, the following equation is obtained:

$$\frac{Q(y)}{2C_{Si}\phi_t} + \coth^{-1}\left[\frac{Q_{g1}(y)}{Q(y)}\right] - \coth^{-1}\left[-\frac{Q_{g2}(y)}{Q(y)}\right] = 0 \quad (3.7)$$

Q(y) is a quantity homogeneous to a charge that is either real, in hyperbolic mode, or imaginary, in trigonometric mode, whose sign is not defined a priori. In the hyperbolic mode, Q is closely linked to the transverse electric field within the channel, while, in the trigonometric mode, interfaces are essentially decoupled and Ca is an imaginary number.

Using dimensionless parameters, boundary conditions (3.2) and (3.3) give:

$$q_1 = x_{g1} - x_1 \quad (3.8)$$

$$q_2 = x_{g2} - x_2 \quad (3.9)$$

Furthermore, the following equation is defined:

$$A_0 = \frac{2|qn_i\varepsilon_{ch}\phi_t|}{C_{Si}^2\phi_t^2} = \frac{2qn_i t_{Si}^2}{\varepsilon_{ch}\phi_t} \quad (3.10)$$

Equations (3.4) to (3.7) become respectively:

$$k_1 q_1 + k_2 q_2 + q_i = 0 \quad (3.11)$$

$$q^2 = k_1^2 q_1^2 - A_0 e^{-x_n} e^{x_{g1} - q_1} \quad (3.12)$$

$$q^2 = k_2^2 q_2^2 - A_0 e^{-x_n} e^{x_{g2} - q_2} \quad (3.13)$$

$$q \coth(q/2)(k_1 q_1 + k_2 q_2) + k_2 q_2 k_1 q_1 + q^2 = 0 \quad (3.14)$$

With $q_1 = Q_{g1}/(C_{ox1} f_t)$ $q_2 = Q_{g2}/(C_{ox2} f_t)$ $q_i = Q_{inv}/(C_{Si} f_t)$ $q = Q/(C_{Si} f_t)$ Equation (3.14) presents several benefits: first, the term $q\coth(q/2)$, which becomes $\mathrm{Im}(q)\cot(\mathrm{Im}(q)/2)$ in the trigonometric mode, can be considered as a function of $q^2$, and it ensures a natural and smooth transition from hyperbolic ($q^2 > 0$) to trigonometric ($q^2 < 0$) regions. Since is it an even function in q, the chosen sign for q doesn't matter and we can re-write (3.14) as:

$$\sqrt{q^2} \coth\left(\frac{\sqrt{q^2}}{2}\right)(k_1 q_1 + k_2 q_2) + k_2 q_2 k_1 q_1 + q^2 = 0 \quad (3.15)$$

The three unknowns to be determined from equations (3.12), (3.13) and (3.15) are now $q_1$, $q_2$ and $q^2$, all real numbers.

Nevertheless, using equation (3.15) instead of (3.14), it is no longer ensured that the solution obtained from the set of equations (3.12), (3.13) and (3.15) is necessary the physically correct one. Indeed, without using the $\cot^{-1}$ function, there is a risk to end up with mathematically correct solutions that correspond to cases where the transverse electric field goes one or more times to $\pm\infty$ within the silicon film. Thus, it is desirable to pay careful attention to this point during the calculation. In particular, the condition $q^2 > -4\pi^2$ should be verified.

In order to calculate analytically the surface potentials, or equivalently the charge densities, from a given initial estimate or guess, a function $f_{zero}$ of a unique variable $q_1$ is determined, from which the brought small corrections are calculated to be brought to this variable. To ensure the stability of the searched function i.e. a behavior that is as close to a linear dependence on $q_1$ as possible, it is desirable to avoid the use of exponential functions of $q_2$. To find first a convenient explicit expression of $q_2$ as a function of $q_1$ and $q^2$, equation (3.15) is expressed in three different equivalent forms:

$$\left(k_1 q_1 + \sqrt{q^2} \coth\left(\frac{\sqrt{q^2}}{2}\right)\right)(k_1 q_1 + k_2 q_2) = k_1^2 q_1^2 - q^2 \quad (3.16)$$

$$\left(k_2 q_2 + \sqrt{q^2} \coth\left(\frac{\sqrt{q^2}}{2}\right)\right)(k_1 q_1 + k_2 q_2) = k_2^2 q_2^2 - q^2 \quad (3.17)$$

$$\left(k_1 q_1 + \sqrt{q^2} \coth\left(\frac{\sqrt{q^2}}{2}\right)\right)\left(k_2 q_2 + \sqrt{q^2} \coth\left(\frac{\sqrt{q^2}}{2}\right)\right) = q^2\left(\coth\left(\frac{\sqrt{q^2}}{2}\right)^2 - 1\right) \quad (3.18)$$

From (3.16) and (3.17) together with (3.12) and (3.13), we find:

$$\left(k_1 q_1 + \sqrt{q^2} \coth\left(\frac{\sqrt{q^2}}{2}\right)\right) e^{x_{g2} - q_2} = \left(k_2 q_2 + \sqrt{q^2} \coth\left(\frac{\sqrt{q^2}}{2}\right)\right) e^{x_{g1} - q_1} \quad (3.19)$$

Then, this last equation with (3.18) gives:

$$\left(k_1 q_1 + \sqrt{q^2} \coth\left(\frac{\sqrt{q^2}}{2}\right)\right)^2 e^{x_{g2} - q_2 - x_{g1} + q_1} = \frac{q^2}{\sinh(\sqrt{q^2}/2)^2} \quad (3.20)$$

From equation (3.20), $q_2$ is expressed as a function of $q_1$ and $q^2$:

$$q_2 = x_{g2} - x_{g1} + q_1 + 2\ln\left(k_1 q_1 + \sqrt{q^2} \coth\left(\frac{\sqrt{q^2}}{2}\right)\right) - \ln\left(\frac{q^2}{\sinh(\sqrt{q^2}/2)^2}\right) \quad (3.21)$$

Considering $q^2$ as a function of $q_1$ thanks to equation (3.12), equation (3.21) defines $q_2$ as a function of $q_1$.

Then, the inversion charge density as a function of $q_1$ is obtained from the charge conservation equation (3.11) and the function to be solved is obtained from (3.16) and (3.12):

$$\left(k_1 q_1 + \sqrt{q^2} \coth\left(\frac{\sqrt{q^2}}{2}\right)\right) q_i + A_0 e^{-x_n} e^{x_{g1} - q_1} = 0 \quad (3.22)$$

Consequently, the following calculation sequence is obtained:

$$f_{q^2}(q_1) = k_1^2 q_1^2 - A_0 e^{-x_n} e^{x_{g1} - q_1} \quad (3.23)$$

$$f_q(q_1) = \sqrt{|f_{q^2}(q_1)|} \quad (3.24)$$

$$\begin{cases} f_{q\coth}(q_1) = f_q(q_1)\coth\left(\frac{f_q(q_1)}{2}\right) & \text{if } f_{q^2}(q_1) \geq 0 \\ f_{q\coth}(q_1) = f_q(q_1)\cot\left(\frac{f_q(q_1)}{2}\right) & \text{if } f_{q^2}(q_1) < 0 \end{cases} \quad (3.25)$$

$$\begin{cases} f_{sh\_term}(q_1) = \frac{f_{q^2}(q_1)}{\sinh(f_q(q_1)/2)^2} & \text{if } f_{q^2}(q_1) \geq 0 \\ f_{sh\_term}(q_1) = \frac{-f_{q^2}(q_1)}{\sin(f_q(q_1)/2)^2} & \text{if } f_{q^2}(q_1) < 0 \end{cases} \quad (3.26)$$

$$f_{ln}(q_1) = ln(f_{sh\_term}(q_1)) \quad (3.27)$$

$$f_{k_1 q_1 + q\coth}(q_1) = k_1 q_1 + f_{q\coth}(q_1) \quad (3.28)$$

$$f_{q_2}(q_1) = x_{g2} - x_{g1} + q_1 + 2\ln(f_{k_1 q_1 + q\coth}(q_1)) - f_{ln}(q_1) \quad (3.29)$$

$$f_{q_i}(q_1) = -k_1 q_1 - k_2 f_{q_2}(q_1) \quad (3.30)$$

$$f_{zero}(q_1) = -f_{k_1 q_1 + q\coth}(q_1) f_{q_i}(q_1) - A_0 e^{-x_n} e^{x_{g1} - q_1} \quad (3.31)$$

First Basic Correction Step:

The first correction step 103 comprises a step of calculation of a value of $q^2$ (noted $q_{sq,1}$) as a function of $q_{1,init}$:

$$q_{sq,1} = k_1^2 q_{1,init}^2 - A_0 e^{-x_n} e^{x_{g1} - q_{1,init}}$$

The first correction step 103 comprises then a step of calculation of a value of $q_2$ (noted $q_{2,1}$) as a function of $q_{1,init}$:

If $q_{sq,1} > 0$:

$$q_{2,1} = x_{g2} - x_{g1} + q_{1,init} + 2\ln\left(k_1 q_{1,init} + \sqrt{q_{sq,1}} \coth\left(\frac{\sqrt{q_{sq,1}}}{2}\right)\right) - \ln\left(\frac{q_{sq,1}}{\sinh(\sqrt{q_{sq,1}}/2)^2}\right)$$

If $q_{sq,1} < 0$:

$$q_{2,1} = x_{g2} - x_{g1} + q_{1,init} + 2\ln\left(k_1 q_{1,init} + \sqrt{-q_{sq,1}} \cot\left(\frac{\sqrt{-q_{sq,1}}}{2}\right)\right) - \ln\left(\frac{-q_{sq,1}}{\sin(\sqrt{-q_{sq,1}}/2)^2}\right)$$

The first correction step 103 comprises then a step of calculation of the value of the function $f_{zero}$ to be nullified as a function of $q_{1,init}$:

If $q_{sq,1} > 0$:

$$f_{zero} = \left(k_1 q_{1,init} + \sqrt{q_{sq,1}} \coth\left(\frac{\sqrt{q_{sq,1}}}{2}\right)\right)(k_1 q_{1,init} + k_2 q_{2,1}) - A_0 e^{-x_n} e^{x_{g1} - q_{1,init}}$$

If $q_{sq,1} < 0$:

$$f_{zero} = \left(k_1 q_{1,init} + \sqrt{-q_{sq,1}} \cot\left(\frac{\sqrt{-q_{sq,1}}}{2}\right)\right)(k_1 q_{1,init} + k_2 q_{2,1}) - A_0 e^{-x_n} e^{x_{g1} - q_{1,init}}$$

The first correction step 103 comprises then a step of analytical calculation, using the physical processor 202, of the 1$^{st}$ and 2$^{nd}$ derivatives, in the case of a second order Taylor development, of $f_{zero}$ with respect to $q_1$ at $q_1 = q_{1,init}$ from the above equations.

The first correction step 103 comprises then a step of calculation of the corrected value of $q_1$ (noted $q_{1,1}$):

$$q_{1,1} = q_{1,init} - \frac{f_{zero}}{\frac{df_{zero}}{dq_1} - \frac{f_{zero}}{2}\frac{d^2 f_{zero}}{dq_1^2} / \frac{df_{zero}}{dq_1}}$$

Figure 5:
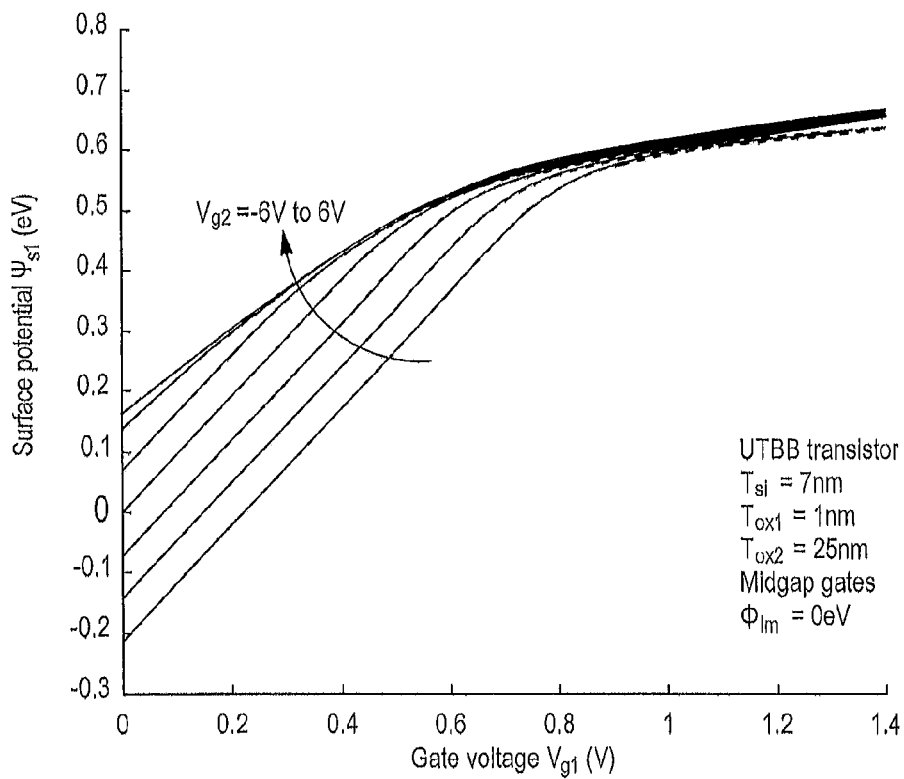
FIG. 5 represents the surface potential at the front gate interface as a function of the front gate voltage for different back gate bias values, in plain line after the first basic correction step and in dash line after a numerical method of F. Liu et al, IEEE Trans. On Electron Devices, vol 55, no 3, pp 816-826, 2008.
Figure 6:
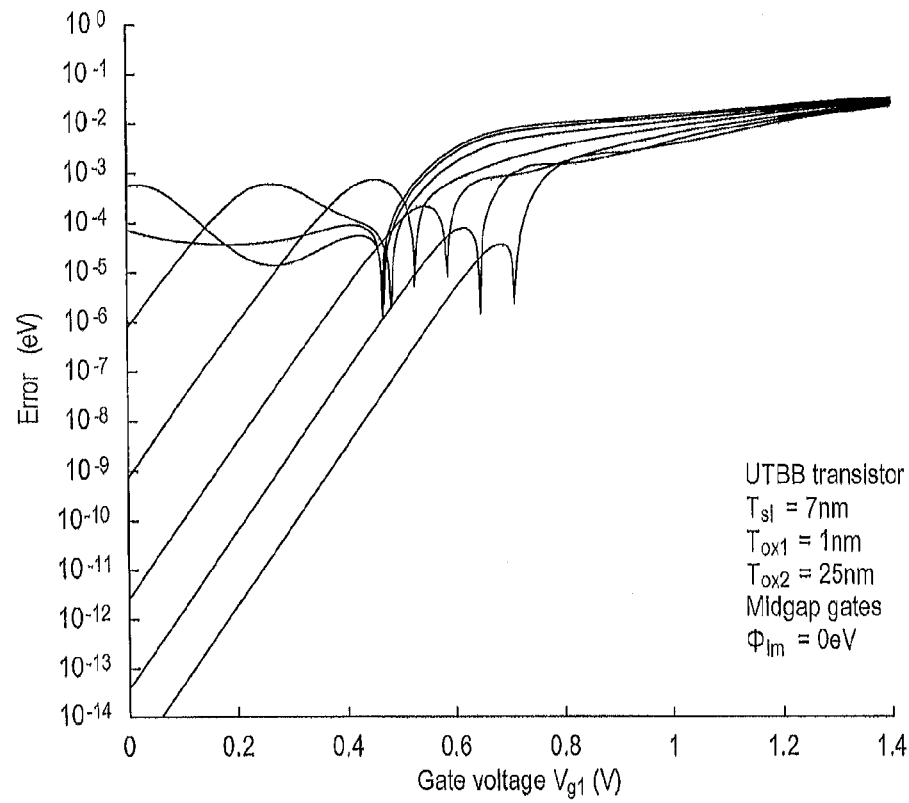
FIG. 6 represents the error on the surface potential at the front interface as a function of the front gate voltage for various back gate bias values after the first basic correction step.

FIG. 5 represents, in plain lines, the surface potential obtained after the first basic correction, at the front gate interface as a function of the front gate voltage for different back gate bias values. FIG. 5 represents, in dash lines, the surface potential obtained by a numerical calculation of the prior art, at the front gate interface as a function of the front gate voltage for different back gate bias values. FIG. 6 represents the error on the surface potential at the front interface as a function of the front gate voltage for various back gate bias values after the first basic correction step.

First Intermediate Correction Step

The method comprises then a step 104 of determining if an intermediate correction step is desired or not before the second basic correction step. To that purpose, the method uses a parameter $D = x_{g1} - x_{1,Si} + \ln(10k_1)$ representative of the double gate transistor such that, when the charge density of the first gate is inferior to the parameter D, the first interface is in a strong inversion regime.

The step 104 comprises then first a step of calculating, using the physical processor 202, the parameter D.

The step 104 comprises then a step of comparing, using the physical processor 202, the first corrected value $q_{1,1}$ obtained after the first basic correction with the parameter D.

If the first corrected value $q_{1,1}$ obtained after the first basic correction step is inferior to the parameter D, then the method comprises a step 105 of performing a first intermediate correction on the first corrected value $q_{1,1}$.

The first intermediate correction step 105 comprises first a step of estimating a second value of $q^2$ (noted $q_{sq,2}$) from $q_{1,1}$ and $q_{2,init}$ given by:

$$q_{sq,2} = \frac{\sqrt{b^2 - 4ac} - b}{2a}$$

Where $$a = 1 + \left(\frac{1}{6} - \frac{1}{\pi^2}\right)(k_1 q_{1,1} + k_2 q_{2,init}),$$

$$b = 4\pi^2 + k_1 q_{1,1} k_2 q_{2,init} + 2\left(1 + \frac{\pi^2}{3}\right)(k_1 q_{1,1} + k_2 q_{2,init})$$

and $$c = 4\pi^2 k_1 q_{1,1} k_2 q_{2,init} + 8\pi^2(k_1 q_{1,1} + k_2 q_{2,init})$$

The first intermediate correction step 105 comprises then a step of calculating, using the physical processor, a first intermediate value:

$$q_{1,2} = q_{1,1} - \frac{1 + 2k_1^2 q_{1,1}/(k_1^2 q_{1,1}^2 - q_{sq,2})}{q_{1,1} - x_{g1} + x_n + \ln((k_1^2 q_{1,1}^2 - q_{sq,2})/A_0)}$$

If the strong inversion condition is not fulfilled:

$$q_{1,2} = q_{1,1}$$

Second Intermediate Correction Step

The method comprises then a step 106 of comparing the value of $q_{1,2}$ obtained after the first intermediate correction step with the parameter D to determine if a second intermediate correction step is desired.

Consequently, the second intermediate step is performed only if $x_{g1} - q_{1,2} > x_{1,Si} - \ln(10k_1)$, i.e. if the strong inversion condition is fulfilled.

The second intermediate step 107 comprises first a step of estimating, using the physical processor 202, a third value of $q^2$ (noted $q_{sq,3}$) from $q_{1,2}$ and $q_{2,init}$:

$$q_{sq,3} = \frac{\sqrt{b^2 - 4ac} - b}{2a}$$

Where $$a = 1 + \left(\frac{1}{6} - \frac{1}{\pi^2}\right)(k_1 q_{1,2} + k_2 q_{2,init}),$$

$$b = 4\pi^2 + k_1 q_{1,2} k_2 q_{2,init} + 2\left(1 + \frac{\pi^2}{3}\right)(k_1 q_{1,2} + k_2 q_{2,init})$$

and $$c = 4\pi^2 k_1 q_{1,2} k_2 q_{2,init} + 8\pi^2 (k_1 q_{1,2} + k_2 q_{2,init})$$

The second intermediate step 107 comprises then a step of refining the third value of the $q^2$ estimation (noted $q_{sq,3b}$):

$$q_{sq,3b} = q_{sq,3} - \frac{k_1 q_{1,2} k_2 q_{2,init} + q_{sq,3} + (k_1 q_{1,2} + k_2 q_{2,init})\alpha}{1 + (k_1 q_{1,2} + k_2 q_{2,init})(q_{sq,3} + 2\alpha - \alpha^2)/(4 q_{sq,3})}$$

With $$\alpha = \sqrt{q_{sq,3}} \coth\left(\frac{\sqrt{q_{sq,3}}}{2}\right)$$

if $q_{sq,3} > 0$ and $$\alpha = \sqrt{-q_{sq,3}} \cot\left(\frac{\sqrt{-q_{sq,3}}}{2}\right)$$

if $q_{sq,3} < 0$.

The second intermediate step 107 comprises then a step of calculating a second intermediate corrected value of $q_1$ (noted $q_{1,3}$) if the strong inversion condition, specified by $x_{g1} - q_{1,2} > x_{1,SI} - \ln(10 k_1)$, is verified:

$$q_{1,3} = q_{1,2} - \frac{1 + 2k_1^2 q_{1,2}/(k_1^2 q_{1,2}^2 - q_{sq,3b})}{q_{1,2} - x_{g1} + x_n + \ln((k_1^2 q_{1,2}^2 - q_{sq,3b})/A_0)}$$

If the strong inversion condition is not fulfilled:

$$q_{1,3} = q_{1,2}$$

Figure 7:
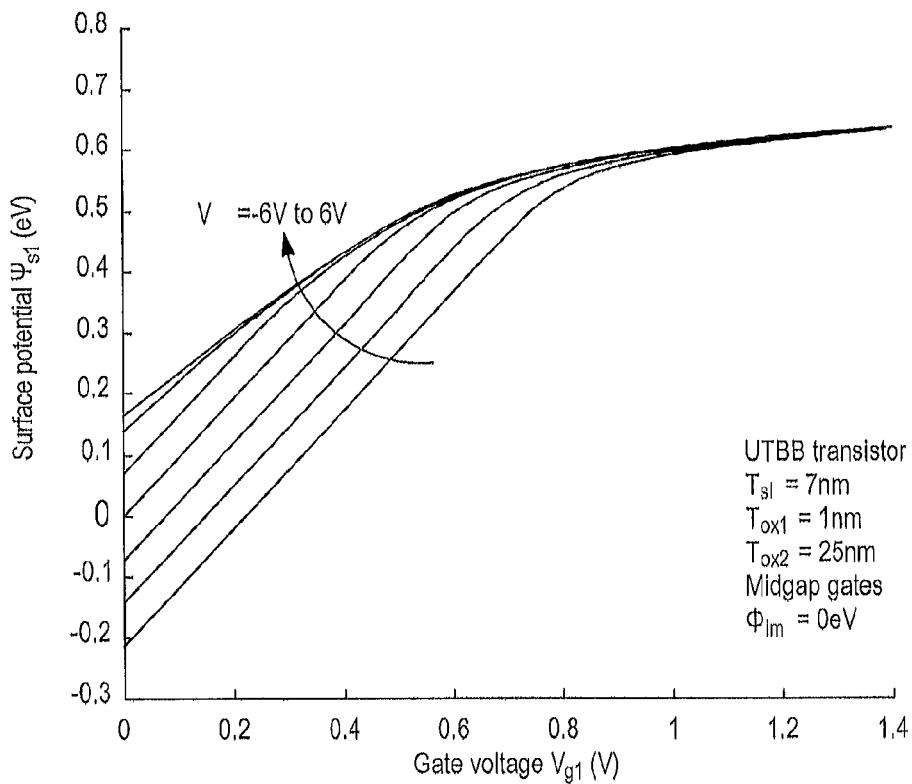
FIG. 7 represents the surface potential at the front interface as a function of the front gate voltage for various back gate bias values, in plain lines after the second intermediate correction step, and in dashed lines after a numerical calculation of F. Liu et al, IEEE Trans. On Electron Devices, vol 55, no 3, pp 816-826, 2008.
Figure 8:
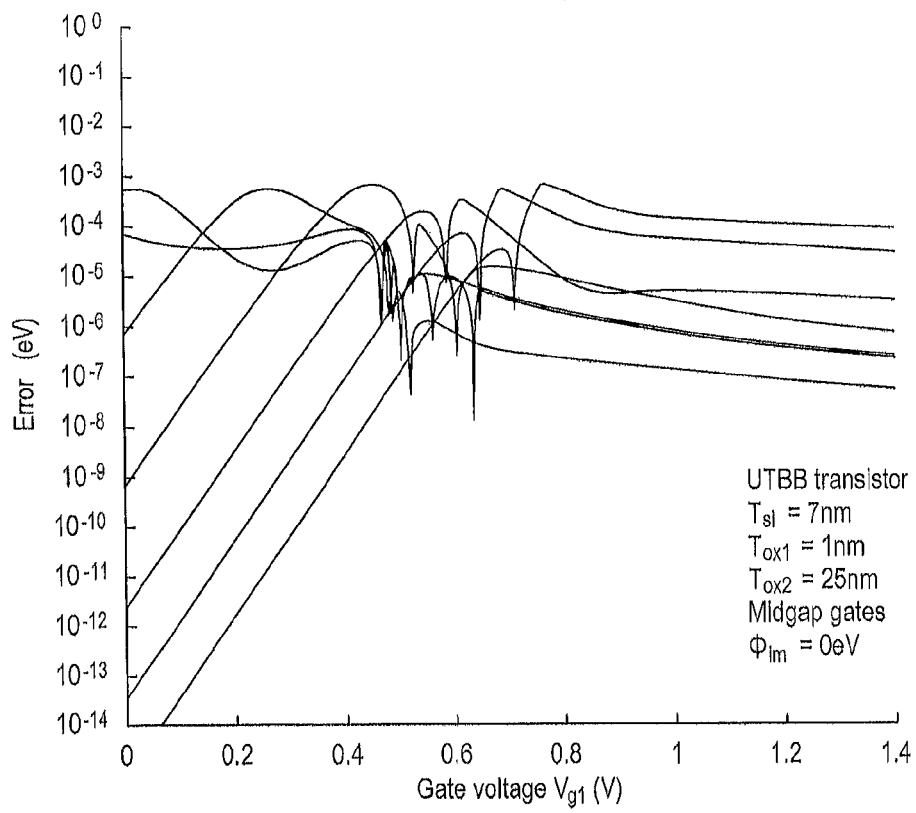
FIG. 8 represents the error on the surface potential at the front interface as a function of the front gate voltage for various back gate bias values after the second intermediate correction step.

FIG. 7 represents the surface potential at the front interface as a function of the front gate voltage for various back gate bias values, in plain lines after the second intermediate correction step, and in dashed lines after a numerical calculation of the prior art. FIG. 8 represents the error on the surface potential at the front interface as a function of the front gate voltage for various back gate bias values after the second intermediate correction step.

Second and Third Basic Correction Steps

The method further comprises a second and a third basic correction steps 108 and 109. Each of these steps are carried out as the first one.

For the second basic correction step 108, the input value of $q_1$ is $q_{1,3}$ instead of $q_{1,init}$. The output of the second basic correction step is used as the input value of the third basic correction step to find the final value of $q_1$: $q_{1,final}$.

Figure 9:
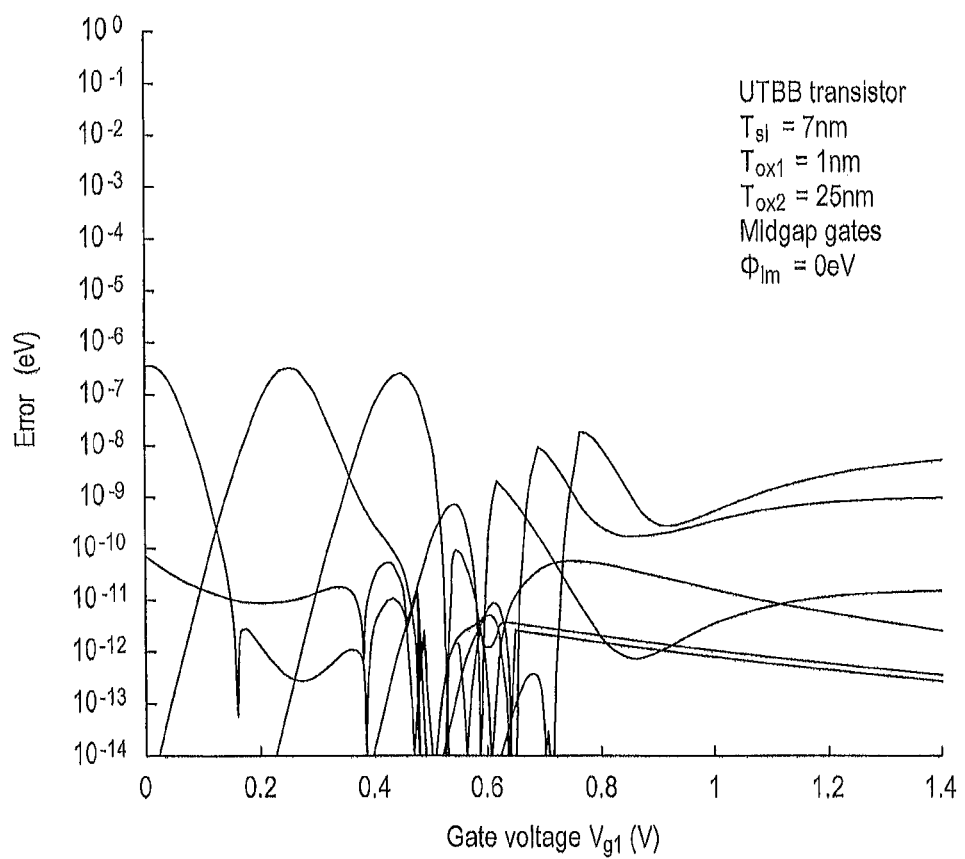
FIG. 9 represents the error on the surface potential at the front interface as a function of the front gate voltage for various back gate bias values after the third basic correction step.

FIG. 9 represents the error on the surface potential at the front interface as a function of the front gate voltage for various back gate bias values after the third basic correction step.

Finally are calculated the value of $q_2$ ($q_{2,final}$) from the abovementioned equations, and the normalized surface potentials are given by:

$$x_{1,final} = x_{g1} - q_{1,final}$$

$$x_{2,final} = x_{g2} - q_{2,final}$$

The above calculations are carried out, and equations are determined, using code instructions embedded in the memory 203. Those code instructions are executed by the processor 202 to carry out the desired calculation.

Having described and illustrated the principles of the invention with reference to various embodiments, it will be recognized that the various embodiments can be modified in arrangement and detail without departing from such principles. It should be understood that the programs, processes, or methods described herein are not related or limited to any particular type of computing environment, unless indicated otherwise. Various types of specialized computing environments may be used with or perform operations in accordance with the teachings described herein. Elements of embodiments shown in software may be implemented in hardware and vice versa.

The devices, processors or processing devices described herein may be configured to execute one or more sequences of one or more instructions contained in a main memory or a computer readable medium. Execution of the sequences of instructions contained in a main memory or a computer readable medium causes the processor to perform at least some of the process steps described herein. One or more processors in a multi-processing arrangement may also be employed to execute the sequences of instructions contained in a main memory or a computer readable medium. In alternative embodiments, hard-wired circuitry may be used in place of or in combination with software instructions. Thus, embodiments are not limited to any specific combination of hardware circuitry and software.

The term "computer readable medium" as used herein refers to any physical medium that participates in providing instructions to a processor for execution. Such a medium may take many forms, including but not limited to, non-volatile media, volatile media, and transmission media. Non-volatile media include, for example, optical or magnetic disks. Volatile media include dynamic memory. Transmission media include coaxial cables, copper wire and fiber optics. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to processor for execution.

While the present invention has been particularly described with reference to the preferred embodiments, it should be readily apparent to those of ordinary skill in the art that changes and modifications in form and details may be made without departing from the scope of the invention. For example, we have presented here the typical procedure followed to obtain the interface potentials. In order to ensure the numerical robustness of the calculations in all geometry and bias configurations, some equations can be used in a slightly different way or in a slightly different order in certain cases. For example, a $3^{rd}$ order Taylor expansion of some equations may be used for $q^2$ close to 0 in order to avoid division by 0.

What is claimed is:

1. A computer implemented method for calculating a charge density $q_1$ of a first gate of a double gate transistor comprising a thin body with a first and a second gate interface, the method comprising:

determining, using a physical processor, an initial estimate $q_{1,init}$ of the charge density of the first gate;

performing, using the physical processor, at least two corrections of the initial estimate based on a Taylor development of a function $f_{zero}(q_1)$ that is nullifiable by a correct value of the charge density $q_1$ of the first gate to determine a corrected value of the charge density $q_1$ of the first gate of the double gate transistor.

2. The computer implemented method according to claim 1, wherein the Taylor development is a second order Taylor development.

3. The computer implemented method according to claim 1, comprising performing, using the physical processor, three corrections of the initial estimate based on a Taylor development of a function $f_{zero}(q_1)$ that is nullifiable by a correct value of the charge density $q_1$ of the first gate.

4. The computer implemented method according to claim 1, wherein each correction comprises calculating, using the physical processor, an intermediate value $q_{sq,j}$ as a function of a value $q_{1,j-1}$ obtained in a previous step of the method, the intermediate value being given by:

$q_{sq,j} = k_1^2 q_{1,j-1}^2 - A_0 e^{-x_n} e^{x_{g1} - q_{1,j-1}}$ $x_{g1}$ being the normalized first gate potential;
$x_n$ being the normalized source or drain potential;
$k_1$ being the normalized first gate capacitance;

$$A_0 = \frac{2qn_i T_{Si}^2}{\varepsilon_{ch} \phi_t},$$

$n_i$ being the intrinsic carrier density in a thin body, $T_{Si}$ being the effective thin body film thickness, $\varepsilon_{ch}$ being the thin body dielectric permittivity, $\phi_t$ being the thermal potential of the double gate transistor, q being the elementary charge.

5. The computer implemented method according to claim 4, wherein each correction further comprises calculating, using the physical processor, a value $q_{2,j}$ of the charge density of the second gate given by:

if $q_{sq,j} > 0$:

$q_{2,j} = x_{g2} - x_{g1} + q_{1,j-1} +$
$2 \ln \left( k_1 q_{1,j-1} + \sqrt{q_{sq,j}} \coth \left( \frac{\sqrt{q_{sq,j}}}{2} \right) \right) - \ln \left( \frac{q_{sq,j}}{\sinh(\sqrt{q_{sq,j}}/2)^2} \right)$ if $q_{sq,j} < 0$:

$q_{2,j} = x_{g2} - x_{g1} + q_{1,j-1} +$
$2 \ln \left( k_1 q_{1,j-1} + \sqrt{-q_{sq,j}} \cot \left( \frac{\sqrt{-q_{sq,j}}}{2} \right) \right) - \ln \left( \frac{-q_{sq,j}}{\sin(\sqrt{-q_{sq,j}}/2)^2} \right)$ $x_{g1}$ being the normalized first gate potential;
$x_{g2}$ being the normalized first gate potential;
$x_n$ being the normalized source or drain potential;
$k_1$ being the normalized first gate capacitance;

$k_2$ being the normalized second gate capacitance;
$q_1$ being the charge density of the first gate;
$q_2$ being the charge density of the second gate;

$$A_0 = \frac{2qn_i T_{Si}^2}{\varepsilon_{ch} \phi_t},$$

$n_i$ being the intrinsic carrier density in a thin body, $T_{Si}$ being the effective thin body film thickness, $\varepsilon_{ch}$ being the thin body dielectric permittivity, $\phi_t$ being the thermal potential of the double gate transistor, q being the elementary charge.

6. The computer implemented method according to claim 5, wherein each correction further comprises determining, using the physical processor, a value for the function $f_{zero}(q_1)$ that is nullifiable by a correct value of the charge density $q_1$ of the first gate, $f_{zero}(q_1)$ being given by:

if $q_{sq,j} > 0$:

$f_{zero}(q_1) =$
$\left( k_1 q_{1,j-1} + \sqrt{q_{sq,j}} \coth \left( \frac{\sqrt{q_{sq,j}}}{2} \right) \right)(k_1 q_{1,j-1} + k_2 q_{2,j}) - A_0 e^{-x_n} e^{x_{g1} - q_{1,j-1}}$ if $q_{sq,j} < 0$:

$f_{zero}(q_1) = \left( k_1 q_{1,j-1} + \sqrt{-q_{sq,j}} \cot \left( \frac{\sqrt{-q_{sq,j}}}{2} \right) \right)(k_1 q_{1,j-1} + k_2 q_{2,j}) -$
$A_0 e^{-x_n} e^{x_{g1} - q_{1,j-1}}.$ 7. The computer implemented method according to claim 6, wherein each correction further comprises calculating, using the physical processor, a first and second derivatives of $f_{zero}$ with respect to $q_1$ at $q_1 = q_{1,j-1}$.

8. The computer implemented method according to claim 7, wherein each correction further comprises calculating, using the physical processor, a corrected value $q_{1,j}$ of charge density of a first gate given by:

$$q_{1,j} = q_{1,j-1} - \frac{f_{zero}}{\frac{df_{zero}}{dq_1} - \frac{f_{zero}}{2} \frac{d^2 f_{zero}}{dq_1^2} / \frac{df_{zero}}{dq_1}}.$$

9. The computer implemented method according to claim 1, wherein determining, using the physical processor, the initial estimate $q_{1,init}$ of the charge density of the first gate comprises:

determining, using the physical processor, a first saturated value of the charge density of the first gate when the first gate interface is in a weak inversion regime;

determining, using the physical processor, a second saturated value of the charge density of the first gate when the first gate interface is in a strong inversion regime;

determining, using the physical processor, the initial estimate of the charge density of the first gate by using a smoothing function between the first and the second saturated value.

10. The computer implemented method according to claim 1, further comprising, between the first and the second corrections:

determining, using the physical processor, a parameter D representative of the double gate transistor such that, when the charge density of the first gate is inferior to the parameter D, the first interface is in a strong inversion regime;

comparing, using the physical processor, the first corrected value $q_{1,1}$ obtained after the first correction with the parameter D.

11. The computer implemented method according to claim 10, wherein if the first corrected value $q_{1,1}$ is inferior to the parameter D, the method further comprises, between the first and the second corrections:

performing, using the physical processor, a first intermediate correction of the first corrected value $q_{1,1}$ to obtain a second corrected value $q_{1,2}$ the first intermediate correction using:
an initial estimate of the charge density of the second gate $q_{2,init}$; and
a first intermediary value $q_{sq,2}$ issued from a first order Taylor expansion of a first intermediary function $f1_{boundary}$ obtained by a first integration of Poisson's equation and by some boundary conditions at the first gate interface.

12. The computer implemented method according to claim 11, wherein the first intermediate correction comprises:

estimating, using the physical processor, a first intermediary value $q_{sq,2}$ from the first corrected value $q_{1,1}$ and the initial guess of the charge density of the second gate $q_{2,init}$:

$$q_{sq,2} = \frac{\sqrt{b^2 - 4ac} - b}{2a}$$

where $$a = 1 + \left(\frac{1}{6} - \frac{1}{\pi^2}\right)(k_1 q_{1,1} + k_2 q_{2,init}),$$

$$b = 4\pi^2 + k_1 q_{1,1} k_2 q_{2,init} + 2\left(1 + \frac{\pi^2}{3}\right)(k_1 q_{1,1} + k_2 q_{2,init})$$

and $c = 4\pi^2 k_1 q_{1,1} k_2 q_{2,init} + 8\pi^2 (k_1 q_{1,1} + k_2 q_{2,init})$ calculating, using the physical processor, the second corrected value $q_{1,2}$ from the first corrected value $q_{1,1}$ and the first intermediary value $q_{sq,2}$:

$$q_{1,2} = q_{1,1} - \frac{1 + 2k_1^2 q_{1,1}/(k_1^2 q_{1,1}^2 - q_{sq,2})}{q_{1,1} - x_{g1} + x_n + \ln((k_1^2 q_{1,1}^2 - q_{sq,2})/A_0)}$$

$x_{g1}$ being the normalized first gate potential;
$x_n$ being the normalized source or drain potential;
$k_1$ being the normalized first gate capacitance;

$$A_0 = \frac{2q n_i T_{Si}^2}{\varepsilon_{ch} \phi_t},$$

$n_i$ being the intrinsic carrier density in a thin body, $T_{Si}$ being the effective thin body film thickness, $\varepsilon_{ch}$ being the thin body dielectric permittivity, $\phi_t$ being the thermal potential of the double gate transistor, q being the elementary charge.

13. The computer implemented method according to claim 12, further comprising, between the first and the second corrections:

comparing, using the physical processor, the second corrected value $q_{1,2}$ with the parameter D.

14. The computer implemented method according to claim 13, wherein, if the second corrected value $q_{1,2}$ is inferior to the parameter D, the method further comprises, between the first and the second corrections:

performing, using the physical processor, a second intermediate correction of the second corrected value $q_{1,2}$ to obtain a third corrected value $q_{1,3}$, the second intermediate correction using:
an initial estimate of the charge density of the second gate $q_{2,init}$; and
a third intermediary value $q_{sq,3}$ issued from a first order Taylor expansion of a second intermediary function $f2_{boundary}$ obtained by a second integration of Poisson's equation and by some boundary conditions at the first gate interface.

15. The computer implemented method according to claim 14, wherein the second intermediate analytical correction comprises:

estimating, using the physical processor, a second intermediary value $q_{sq,3}$ from the second corrected value $q_{1,2}$ and the initial guess of the charge density of the second gate $q_{2,init}$:

$$q_{sq,3} = \frac{\sqrt{b^2 - 4ac} - b}{2a}$$

where $$a = 1 + \left(\frac{1}{6} - \frac{1}{\pi^2}\right)(k_1 q_{1,2} + k_2 q_{2,init}),$$

$$b = 4\pi^2 + k_1 q_{1,2} k_2 q_{2,init} + 2\left(1 + \frac{\pi^2}{3}\right)(k_1 q_{1,2} + k_2 q_{2,init})$$

and $c = 4\pi^2 k_1 q_{1,2} k_2 q_{2,init} + 8\pi^2 (k_1 q_{1,2} + k_2 q_{2,init})$ refining, using the physical processor, the second intermediary value $q_{sq,3}$ to obtain a third intermediary value $q_{sq,3b}$ such that:

$$q_{sq,3b} = q_{sq,3} - \frac{k_1 q_{1,2} k_2 q_{2,init} + q_{sq,3} + (k_1 q_{1,2} + k_2 q_{2,init})\alpha}{1 + (k_1 q_{1,2} + k_2 q_{2,init})(q_{sq,3} + 2\alpha - \alpha^2)/(4q_{sq,3})}$$

with $$\alpha = \sqrt{q_{sq,3}} \coth\left(\frac{\sqrt{q_{sq,3}}}{2}\right) \text{ if } q_{sq,3} > 0$$

and $$\alpha = \sqrt{-q_{sq,3}} \cot\left(\frac{\sqrt{-q_{sq,3}}}{2}\right) \text{ if } q_{sq,3} < 0.$$

calculating, using the physical processor, the third corrected value $q_{1,3}$ from the second corrected value $q_{1,2}$ and the third intermediary value $q_{sq,3b}$ such that:

$$q_{1,3} = q_{1,2} - \frac{1 + 2k_1^2 q_{1,2}/(k_1^2 q_{1,2}^2 - q_{sq,3b})}{q_{1,2} - x_{g1} + x_n + \ln((k_1^2 q_{1,2}^2 - q_{sq,3b})/A_0)}$$

$x_{g1}$ being the normalized first gate potential;
$x_n$ being the normalized source or drain potential;
$k_1$ being the normalized first gate capacitance;

$$A_0 = \frac{2qn_i T_{Si}^2}{\varepsilon_{ch}\phi_t},$$

$n_i$ being the intrinsic carrier density in a thin body, $T_{Si}$ being the effective thin body film thickness, $\varepsilon_{ch}$ being the thin body dielectric permittivity, $\phi_t$ being the thermal potential of the double gate transistor, q being the elementary charge.

16. The computer implemented method according to claim 10, wherein the parameter D is calculating, using the physical processor, by:

$$D = x_{g1} - \left(x_n + \ln\left(4\frac{k_1 + k_2/(1+k_2)}{A_0}\right) + \ln\left(\frac{\Delta x/2}{th(\Delta x/2)}\right) + 3\right) + \ln(10k_1),$$

$x_{g1}$ being the normalized first gate potential,
$x_n$ being the normalized source or drain potential;
$k_1$ being the normalized first gate capacitance;
$k_2$ being the normalized second gate capacitance;

$$\Delta x = \ln\left(\frac{1+k_1}{1+k_2}\right)$$

$$A_0 = \frac{2qn_i T_{Si}^2}{\varepsilon_{ch}\phi_t},$$

$n_i$ being the intrinsic carrier density in a thin body, $T_{Si}$ being the effective thin body film thickness, $\varepsilon_{ch}$ being the thin body dielectric permittivity, $\phi_t$ being the thermal potential of the double gate transistor, q being the elementary charge.

17. A non-transitory computer storage medium encoded with code instructions for implementing a method for calculating a charge density $q_1$ of a first gate of a double gate transistor comprising a thin body with a first and a second gate interface, the method comprising:

determining, using a physical processor, an initial estimate $q_{1,init}$ of the charge density of the first gate;

performing, using the physical processor, at least two corrections of the initial estimate based on a Taylor development of a function $f_{zero}(q_1)$ that is nullifiable by a correct value of the charge density $q_i$ of the first gate to determine a corrected value of the charge density $q_i$ of the first gate of the double gate transistor.

18. The non-transitory computer storage medium according to claim 17, wherein determining, using the physical processor, the initial estimate $q_{1,init}$ of the charge density of the first gate comprises:

determining, using the physical processor, a first saturated value of the charge density of the first gate when the first gate interface is in a weak inversion regime;

determining, using the physical processor, a second saturated value of the charge density of the first gate when the first gate interface is in a strong inversion regime;

determining, using the physical processor, the initial estimate of the charge density of the first gate by using a smoothing function between the first and the second saturated value.

19. A physical computer comprising:

a physical interface for receiving input parameters;

a non-transitory computer storage medium encoded with code instructions for calculating a charge density $q_1$ of a first gate of a double gate transistor comprising a thin body with a first and a second gate interface, and a physical processor for executing the code instructions, wherein, when the code instructions are executed by the processor, the processor determines an initial estimate $q_{1,init}$ of the charge density of the first gate, and performs at least two corrections of the initial estimate based on a Taylor development of a function $f_{zero}(q_1)$ that is nullifiable by a correct value of the charge density $q_1$ of the first gate to determine a corrected value of the charge density $q_1$ of the first gate of the double gate transistor.

* * * * *